United States Patent
Pratt et al.

(10) Patent No.: US 10,063,265 B2
(45) Date of Patent: Aug. 28, 2018

(54) ULTRA WIDE BAND DIGITAL PRE-DISTORTION

(71) Applicant: Analog Devices Global, Hamilton (BM)

(72) Inventors: Patrick Pratt, Mallow (IE); Claire Masterson, Raheen (IE); Justine Mary McCormack, Kinsale (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/291,898

(22) Filed: Oct. 12, 2016

(65) Prior Publication Data

US 2017/0104503 A1    Apr. 13, 2017

Related U.S. Application Data

(60) Provisional application No. 62/240,706, filed on Oct. 13, 2015.

(51) Int. Cl.
*H04B 1/04* (2006.01)
*H04L 27/36* (2006.01)
(Continued)

(52) U.S. Cl.
CPC ......... *H04B 1/0475* (2013.01); *H03F 1/3247* (2013.01); *H03F 1/3258* (2013.01);
(Continued)

(58) Field of Classification Search
CPC .... H03F 1/3241; H03F 1/3247; H03F 1/3258; H04L 27/367; H04L 27/368; H04B 1/0475; H04B 1/71635; H04B 2001/0425
See application file for complete search history.

(56) References Cited

U.S. PATENT DOCUMENTS 6,304,598 B1 * 10/2001 Agazzi ................. H04B 3/32
  375/232
6,507,798 B1 *  1/2003 Cawley et al. ....... G06F 17/141
  702/106

(Continued)

FOREIGN PATENT DOCUMENTS

CN    106572039 A    4/2017

OTHER PUBLICATIONS

J. Reina-Tosina et al., "Behavioral Modeling and Predistortion of Power Amplifiers Under Sparsity Hypothesis," in IEEE Transactions on Microwave Theory and Techniques, vol. 63, No. 2, pp. 745-753, Feb. 2015.*

(Continued)

*Primary Examiner* — Michelle M Koeth
(74) *Attorney, Agent, or Firm* — Schwegman Lundberg & Woessner, P.A.

(57) ABSTRACT

A digital pre-distortion system can inversely model a power amplifier of a system to linearize the transmitter. A complex baseband model for digital pre-distortion based on a narrowband signal assumption is unworkable for an ultra wide band Cable television application. Predistortion can use a true wide band model including real-valued basis terms, obtained from a real-valued signal. When raised to a power, both even and odd harmonics or both odd or even other non-linear terms are represented and negative frequency fold-over can be accounted for. A Hilbert transform can be applied. Compressed sensing can be used to reduce the number of basis terms in the true real wide band model to generate a sparse model. Sparse equalization can be added to improve the stability of the digital pre-distortion system.

18 Claims, 11 Drawing Sheets

(51) Int. Cl.
  *H04B 1/7163* (2011.01)
  *H03F 1/32* (2006.01)
(52) U.S. Cl.
  CPC ....... *H04B 1/71635* (2013.01); *H04L 27/368* (2013.01); *H04B 2001/0425* (2013.01)

(56) References Cited

U.S. PATENT DOCUMENTS

| | | | | |
|---|---|---|---|---|
| 2008/0285640 | A1* | 11/2008 | McCallister | H04L 25/03044 375/233 |
| 2010/0069023 | A1* | 3/2010 | Coan | H03F 1/3241 455/114.3 |
| 2011/0270590 | A1* | 11/2011 | Aparin | G06K 9/00496 703/2 |
| 2013/0166259 | A1 | 6/2013 | Weber et al. | |
| 2014/0254644 | A1* | 9/2014 | Gotman | H04L 27/01 375/222 |

OTHER PUBLICATIONS

A. Abdelhafiz et al., "Digital Predistortion of LTE-A Power Amplifiers Using Compressed-Sampling-Based Unstructured Pruning of Volterra Series," in IEEE Transactions on Microwave Theory and Techniques, vol. 62, No. 11, pp. 2583-2593, Nov. 2014.*

T. Eriksson et al., "Digital predistortion of concurrent multiband communication systems," 2014 IEEE International Conference on Acoustics, Speech and Signal Processing (ICASSP), Florence, 2014, pp. 3918-3922.*

Abdelhafiz, Abubaker, et al., "Digital Predistortion of LTE-A Power Amplifiers Using Compressed-Sampling-Based Unstructured Pruning of Volterra Series", IEEE Transactions on Microwave Theory and Techniques, 62(11), (Nov. 2014), 2583-2593.

Laki, Bradley D., et al., "Adaptive Digital Predistortion for Wideband High Crest Factor Applications Based on the WACP Optimization Objective: A Conceptual Overview", IEE Transactions on Broadcasting, 58(4), (Dec. 2012), 609-618.

Shi, Kun, et al., "Adaptive sparse Volterra system identification with I0-norm penalty", Signal Processing, 91, (2011), 2432-2436.

"European Application Serial No. 16192676.1, Partial European Search Report dated Mar. 10, 2017", 8 pgs.

"European Application Serial No. 16192676.1, Extended European Search Report dated Jun. 19, 2017", 11 pgs.

* cited by examiner

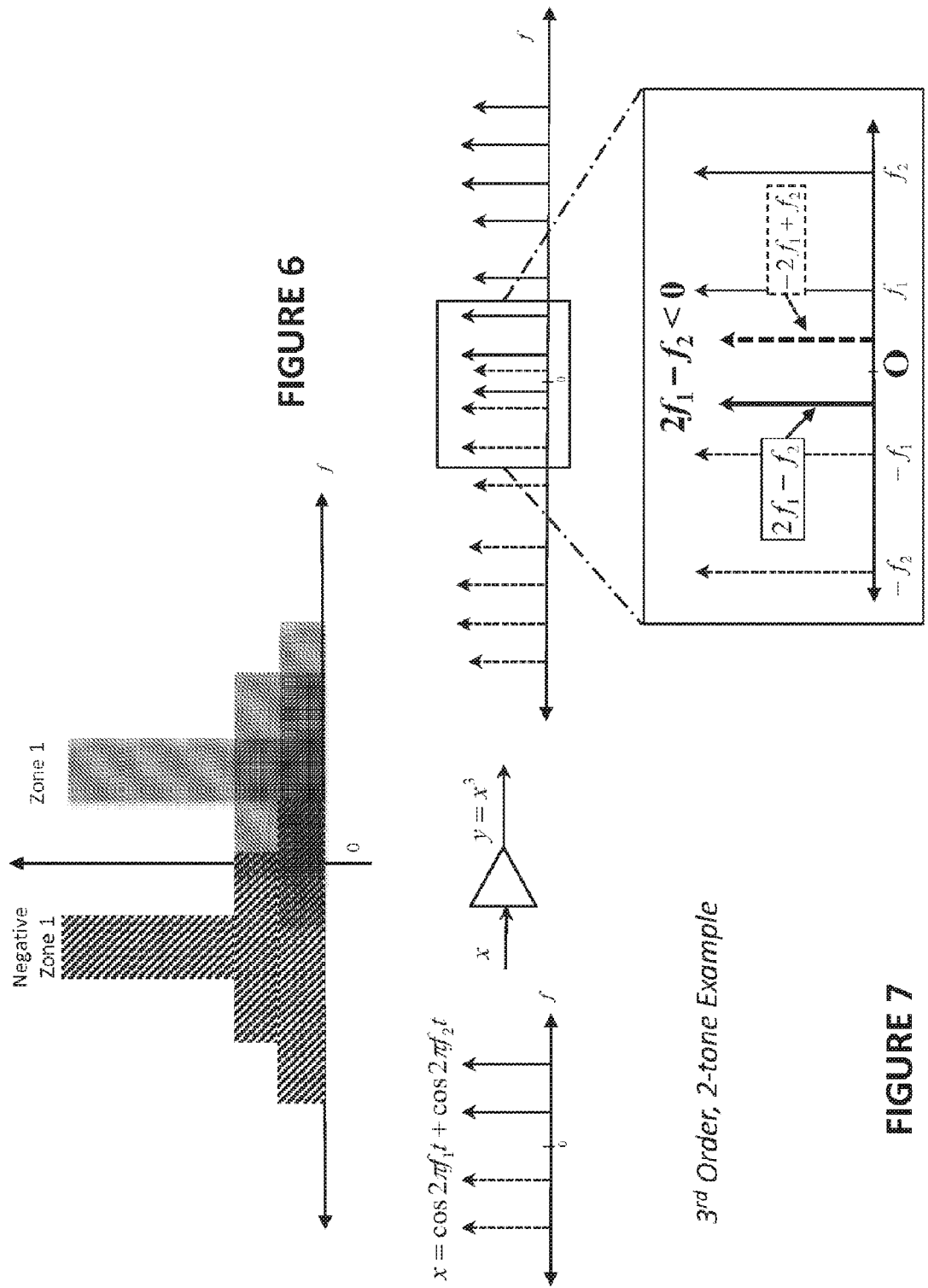

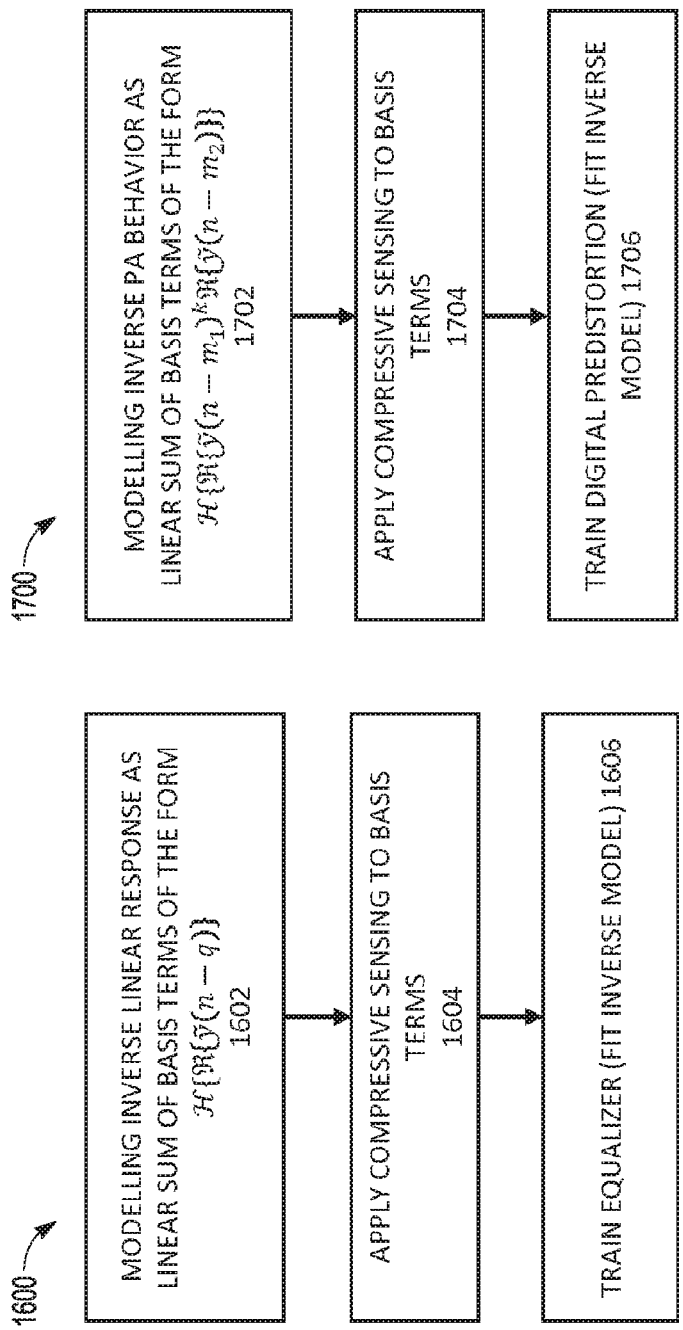

US 10,063,265 B2

ULTRA WIDE BAND DIGITAL PRE-DISTORTION

TECHNICAL FIELD OF THE DISCLOSURE

The present patent application relates to the field of integrated circuits, in particular to circuits implementing ultra wide band digital pre-distortion.

BACKGROUND

Digital pre-distortion systems can be implemented for cellular systems to improve linearity of radio frequency transmitters. A digital pre-distortion system inversely models nonlinear characteristics of a radio power amplifier to improve the linearity of the amplifier and reduce distortions. Such pre-distortion can allow more power to be used from an existing amplifier without having to use a larger, more powerful, and power consuming amplifier.

OVERVIEW

A digital pre-distortion system inversely models a power amplifier of the cellular system to linearize the transmitter. A conventional complex baseband model is often used for digital pre-distortion, which is conveniently based on the assumption that the signal is a narrowband signal, for cellular system, e.g., occupying tens of MegaHertz relative to a carrier frequency of 100 MHz. Cable transmitters often have ultra wide bandwidth occupying 1 gigahertz or more continuous spectrum. Such wide bandwidth requirement renders conventional complex baseband model of the power amplifier unworkable. A new model of the power amplifier for ultra wide band applications involves replacing the conventional complex baseband model with a true real wide band model. A Hilbert transform can be applied to obtain the analytical form. Compressed sensing can be used to reduce the number of basis terms in the true real wide band model. Sparse equalization can be added to improve the stability of the digital pre-distortion system.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 6 illustrates an example of a negative fold over effect near DC;

FIG. 7 illustrates a specific example of a negative fold over effect near DC;

FIG. 16 shows a flow diagram illustrating a method for ultra wide band equalization; and FIG. 17 shows a flow diagram illustrating a method for ultra wide band digital pre-distortion.

DETAILED DESCRIPTION

Digital Pre-Distortion Overview

A transmitter system can include a transmitter and a power amplifier amplifying the output of the transmitter. A digital pre-distortion (DPD) system, aiming to linearize the response of the power amplifier, can integrate with the transmission system by observing the output of the power amplifier, e.g., using an observation receiver, modeling the nonlinearity, and compensating by distorting the input in the forward path based on the nonlinearity. The goal of digital pre-distortion is to distort the input to the transmitter so that the response of the power amplifier behaves linearly. The observed output of the power amplifier can be used to fit an inverse model. Specifically, the output of the power amplifier can be applied to the input of the inverse model, such that the output of the model can be matched against the input to the transmitter as closely as possible. The matching can involve a mean squared error minimization process. A DPD actuator circuit can use the model to digitally pre-distort the input signal to the transmitter.

Understanding Narrowband Assumption and Complex Baseband Model for DPD

In one approach, a DPD model can be applied to a wireless cellular communication system. In such an application, the DPD model can assume that the power amplifier non-linearity of interest extends over a narrow frequency pass band. Narrowband, as used herein and in the industry, means that the pass band bandwidth is significantly smaller than the center (carrier) frequency, e.g., by a factor of 10. For instance, the frequency bandwidth can be 60 MHz for a frequency band centered at 1 GHz. Under this narrowband assumption, such as in the wireless cellular communication system example, the power amplifier can be modelled using a complex baseband model.

Figure 1:
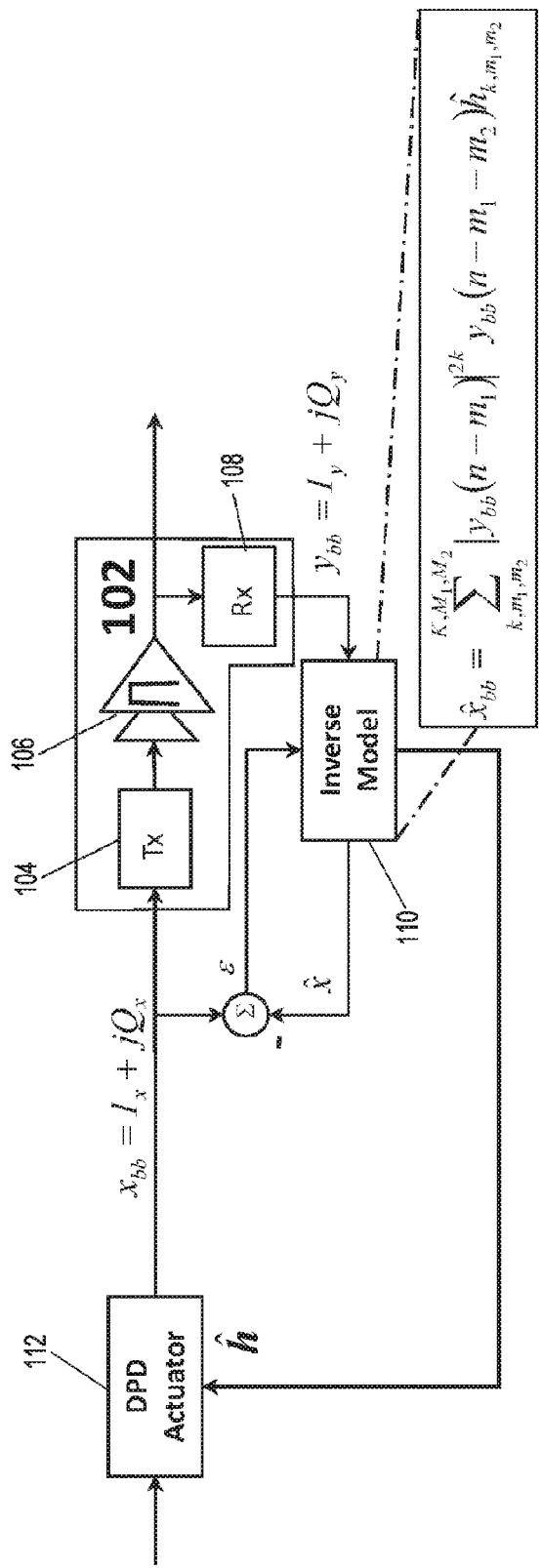
FIG. 1 illustrates a conventional complex baseband model being used for digital pre-distortion.

FIG. 1 illustrates an example of a complex baseband model that can be used for digital pre-distortion. In FIG. 1, a transmitter system 102 is shown. The transmitter system 102 can include a transmitter (Tx) 104, a power amplifier (PA) 106, and an observation receiver (Rx) 108. The input signal to the transmitter, Tx 104, can be a complex baseband signal, which can be represented as $x_{bb}=I_x+jQ_x$. The output signal generated by the observation receiver 106 can also be a complex baseband signal, which can be represented as $y_{bb}=I_y+jQ_y$. Both complex baseband signals can have in-phase and quadrature components (I and Q respectively). The DPD model 110 shown can be a complex baseband model, which can be represented using the mathematical equation shown. The DPD model 110 can be formulated based on the assumption that the power amplifier, PA 106, response resides in a narrow frequency pass band around the carrier frequency: $BW \ll f_c$, where BW is bandwidth and $f_c$ is the carrier frequency. Once determined, the DPD model 110 can be used by the DPD actuator circuit 112 to generate a predistortion that can compensate for a nonlinear characteristic of the power amplifier, PA 106. This can advantageously allow the PA 106 to operate over a broader dynamic range, without suffering from accompanying distortion that would otherwise be present.

Figure 2:
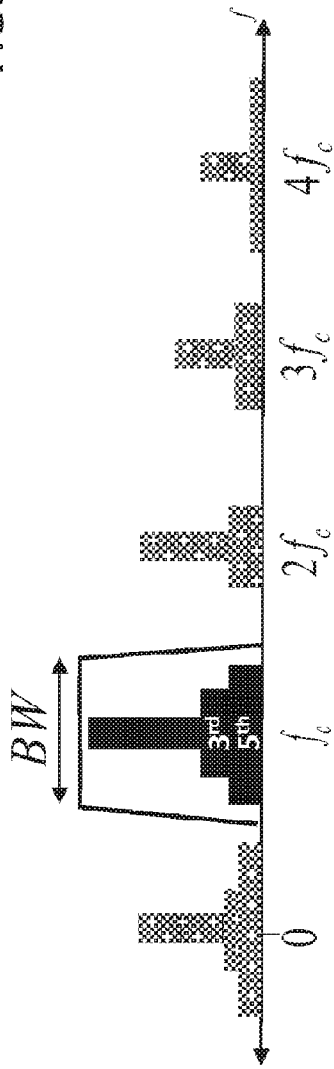
FIG. 2 illustrates distortions and harmonics seen by an observation receiver.

FIG. 2 illustrates an example of distortions and harmonics such as can be seen by an observation receiver, Rx 108. Consider a narrowband signal centered at $f_c$ the observation receiver, Rx 108, would see the narrowband signal and $3^{rd}$ and $5^{th}$ order distortions around $f_c$. While not shown explicitly, $7^{th}$ and $9^{th}$ order distortion terms (and higher odd ordered distortions) are also present around $f_c$. The bracket illustrates the bandwidth (BW), or the band of interest. In this case, the bandwidth is narrow. It can be seen that even ordered distortion terms ($2^{nd}$, $4^{th}$, $6^{th}$ distortions and harmonics ($2^{nd}$ harmonic, $3^{rd}$ harmonic, and so on) fall out of the band of interest. Because this system assumes the bandwidth is narrow, the even ordered distortion terms and harmonics falling out of the band of interest are ignored in the digital pre-distortion model.

Figure 3:
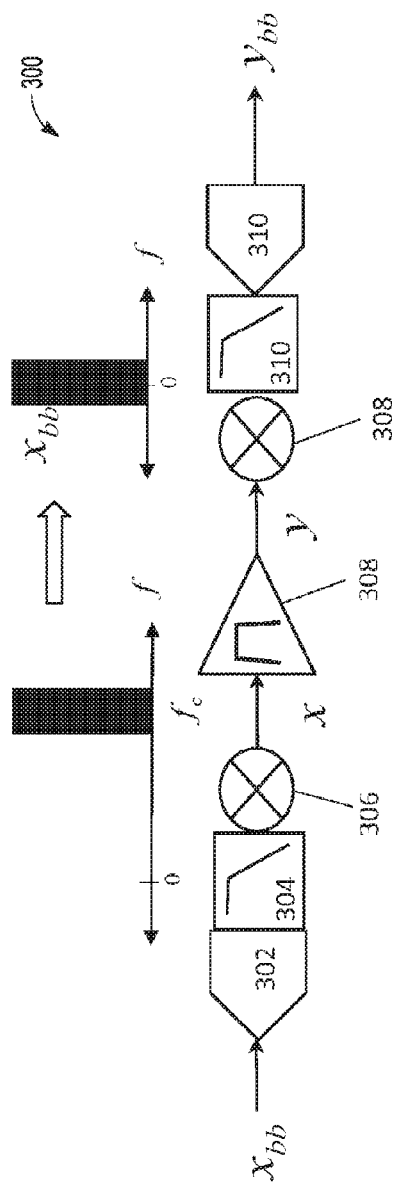
FIG. 3 illustrates a transmitter system and modeling of a narrowband signal.
Figure 4:
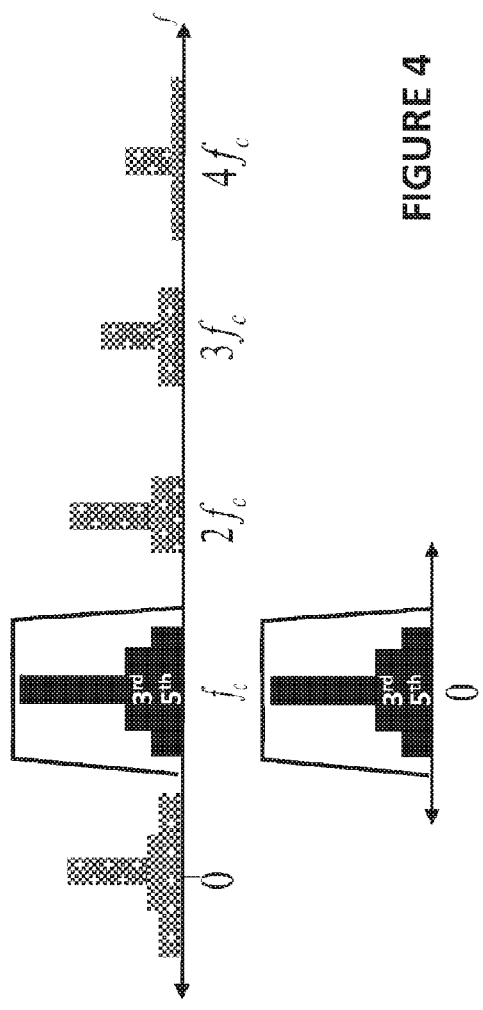
FIG. 4 illustrates filtering out of band distortion.

To arrive at the complex baseband model, consider the example illustrated in FIGS. 3 and 4. FIG. 3 illustrates an example of a transmitter system 300 and modeling of a narrowband signal. FIG. 4 illustrates an example of filtering out even ordered distortions and harmonics. The transmitter system 300 can include a digital-to-analog converter (DAC) circuit 302 taking the complex baseband signal $x_{bb}$ as input, a low pass filter circuit 304, an up converter circuit 306, a power amplifier circuit 308 having input node receiving signal x and output node providing a signal y, a down converter circuit 308, a low pass filter circuit 310, and an analog-to digital converter (ADC) circuit 310, such as for generating the observed output as a complex baseband signal $y_{bb}$. Note that the actual input signal x into the power amplifier, PA 308, can be centered at a carrier frequency $f_c$ (e.g., at 1 GHz). The complex baseband model can be formulated by assuming the narrowband signal is centered around zero Hertz and by modeling the input and output of the power amplifier, PA 308, using the original digital input $x_{bb}$ and the observed digital output $y_{bb}$. These complex baseband signals can be used to fit the inverse model. Hence it can be called a complex baseband model. It is no longer required to explicitly model a signal centered at the carrier frequency $f_c$. As it can be appreciated from FIGS. 2 and 4, even-ordered distortions, $2^{nd}$ harmonic, $3^{rd}$ harmonic, and $4^{th}$ harmonic (and so on) fall outside of the band of interest. All out-of-band (OOB) non-linearities or emissions (at even and odd multiples of the carrier frequency) can thus be removed by a band pass filter circuit which can be located at the output stage of the power amplifier 308. Accordingly, the OOB non-linearities or emissions can be ignored for purposes of digital pre-distortion and for producing an inverse model for being used in digital pre-distortion. Instead, under such narrowband conditions, the model of the power amplifier, PA 308, and its inverse only need consider the in-band non-linearities, such as the odd ordered distortion terms.

Complex Baseband Model Details and Shortcomings

As previously explained, only odd order intermodulation distortion (IMD) terms need be captured by the model if the narrowband assumption applies. Even ordered IMD terms and harmonic distortion (HD) terms fall out of band and hence can be ignored. To model in-band distortion terms, the complex baseband model has basis terms of the form: $|x_{bb}(n-m_1)|^{2k} x_{bb}(n-m_1-m_2)$ and $|y_{bb}(n-m_1)|^{2k} y_{bb}(n-m_1-m_2)$ for the inverse (DPD) model. The formulation takes the magnitude of the complex baseband signal vector $x_{bb}(n-m_1)$ or $|y_{bb}(n-m_1)|^{2k}$ and raises the magnitude to some even power (the term 2k), and multiplies the result by another complex baseband signal vector $x_{bb}(n-m_1-m_2)$ or $y_{bb}(n-m_1-m_2)$. m1 and m2 represent different delays. The multiplication produces an odd effect and thus models odd ordered only behaviour, with no even ordered terms. Since this is performed at baseband, the model does not capture any harmonic effects.

This complex baseband model for digital pre-distortion is inadequate for ultra wide band applications, such as Cable (e.g., Cable television transmitters), in which the bandwidth can extend from 50 megahertz (MHz) to 1.2 gigahertz (GHz). This bandwidth can be ten times wider than the wireless Cellular narrowband scenario, or even wider. For instance, the bandwidth for wired Cable can have, for example, a bandwidth of roughly 1 GHz or more with a center frequency of rough 0.5 GHz. For some applications, the frequency band of interest extends toward 0 Hertz (usually referred to as DC). In such ultra wide band applications, the narrowband assumption no longer applies. The following explanation describes how the complex baseband model can no longer be used for digital pre-distortion in such a situation, in which the narrowband assumption no longer applies.

Figure 5:
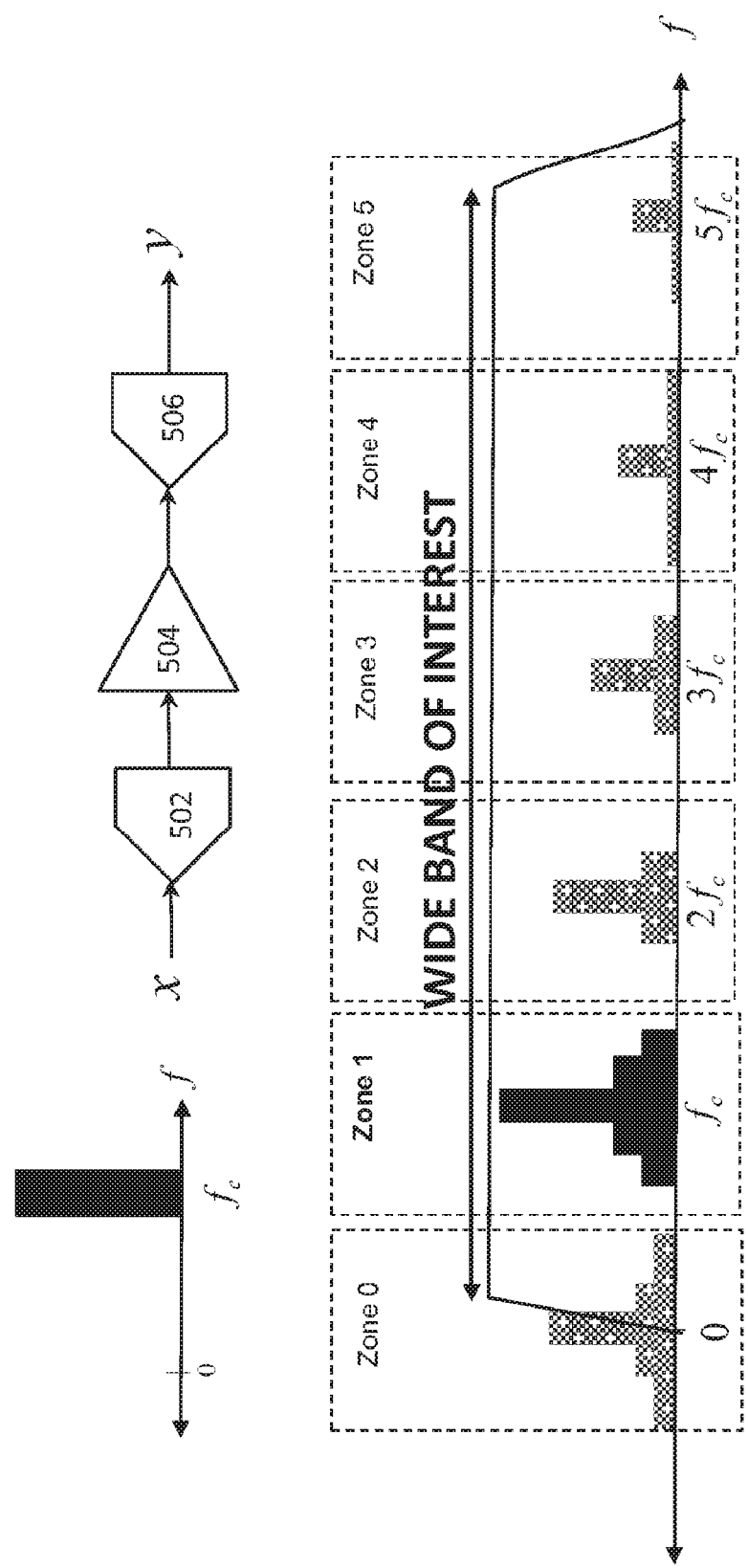
FIG. 5 illustrates an ultra wide band system and ultra wide band non-linearity.

FIG. 5 illustrates an example of an ultra wide band system and accompanying ultra wide band non-linearity. The transmitter shown includes a DAC circuit 502, a power amplifier circuit 504, and an ADC circuit 506. Consider a single (narrow band) channel input of bandwidth BW provided to the input of the transmitter (i.e., the DAC 502). Output distortion can be spread over multiple 'zones' (shown as Zones 0-5). Even ordered terms fall around even order harmonic distortions, HDs, odd order around odd HDs. Even ordered terms, 2k, falls into zone 0, 2, 4, ..., 2k across a (2k×BW) bandwidth; Odd ordered terms, 2k+1, falls into zone 1, 3, 5, ..., 2k+1 across a ((2k+1)×BW) bandwidth. With a much wider band of interest at the output, all zones (e.g., Zones 0-5 in this example) within the band of interest should be considered in the model. Even ordered IMD and HD terms cannot be ignored.

In addition to failing to model even ordered IMD terms and HD terms, the complex baseband model ignores a lower band negative frequency distortion term fold-over effect. This fold-over effect will occur as the lower band edge approaches zero Hertz (usually referred to as DC). FIG. 6 illustrates an example of a negative fold-over effect near DC. Suppose the narrowband signal content is near DC, e.g., 50 MHz. As previously explained, the signal would have $3^{rd}$ and 5th ordered distortions around the signal fundamental frequency. When the fundamental frequency of the signal content is near DC, those $3^{rd}$ and $5^{th}$ ordered effects can fall in the negative frequencies. When the signal is mirrored at zero Hertz, the effects falling in the negative frequencies would fold over to the positive frequencies, as shown conceptually by the overlap in FIG. 6 near DC.

FIG. 7 illustrates a specific example of a negative fold-over effect near DC. In this illustrative example, the input signal x is given as a two toned signal $x=\cos 2\pi f_1 t + \cos 2\pi f_2 t$ at frequency $f_1$ and frequency $f_2$ (which are illustrated as solid line arrows on the frequency spectrum). The input signal x is a real signal, and accordingly, the input signal x has a mirrored image in the $-f_1$ and $-f_2$ (illustrated as dashed line arrows on the frequency spectrum). As an illustrative example, the signal is cubed to generate a $3^{rd}$ ordered effect. When $2f_1-f_2<0$, the $3^{rd}$ order distortions goes into the negative frequencies, and the mirror image of the $3^{rd}$ order distortions folds into the positive frequencies. When using complex signals, the signal content falls either in the positive frequencies or the negative frequencies. Therefore, the complex baseband model ignores the mirror image and thus any fold-over effects. This fold-over effect can fall within the band of interest for the ultra wide band scenario.

Modeling for the Ultra Wide Band Scenario

Figure 8:
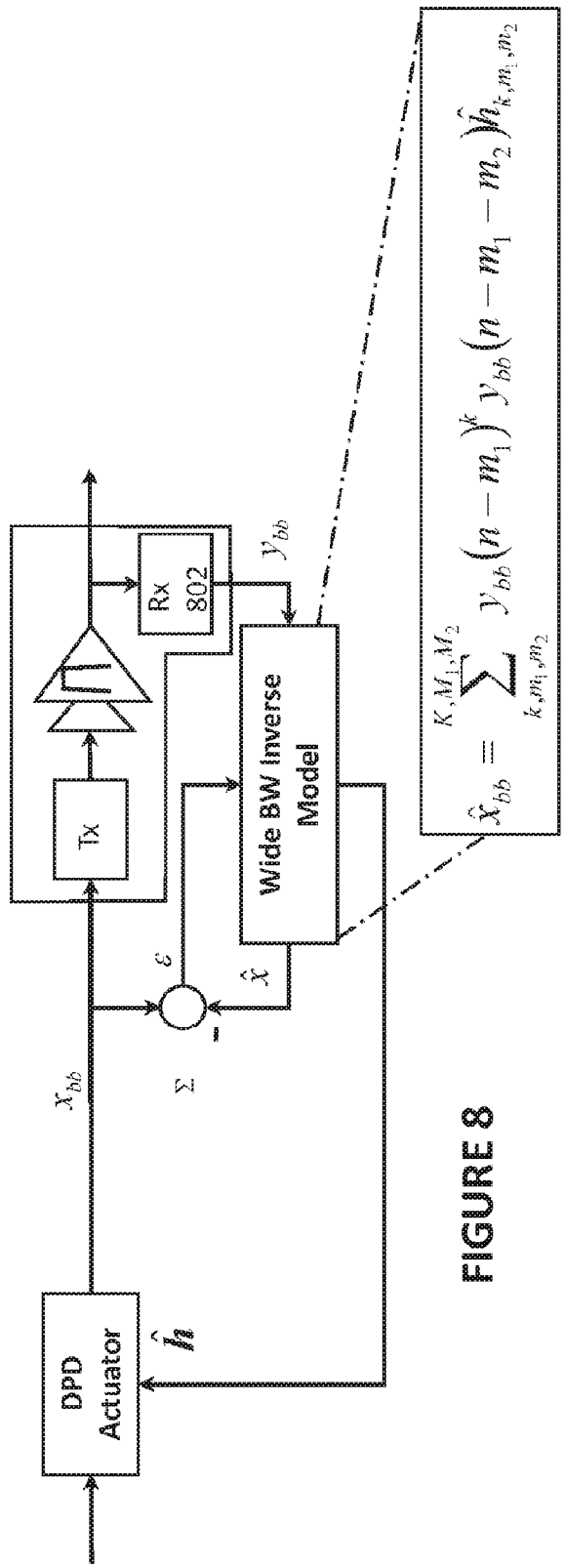
FIG. 8 illustrates a true real wide band model.
Figure 9:
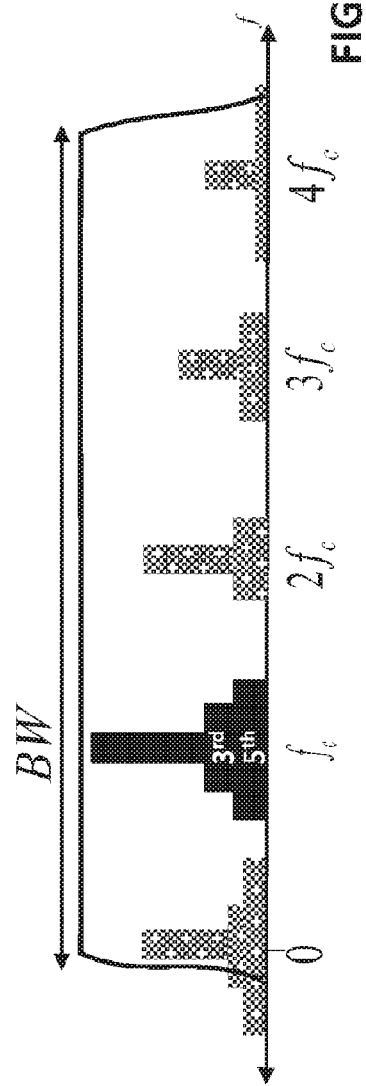
FIG. 9 illustrates distortion terms and harmonics seen by a wide band observation receiver.

To address inadequacies of the complex baseband model, the complex baseband model can be replaced with a true "real" (i.e., not complex) wide band model. FIG. 8 illustrates an example of a true real wide band model. In this example, the DPD observation receiver (Rx) 802 is ultra wide band, and the complete signal (desired and all undesired distortion products) is observed across the full band of interest, such as shown in FIG. 9. In an example, the true real wide band model can have basis terms of the form, $y_{bb}(n-m_1)^k y_{bb}(n-m_1-m_2)$, operating on a real vector, $y_{bb}$. Recall the complex baseband model uses a complex representation for $y_{bb}$ and basis terms $|y_{bb}(n-m_1)|^{2k} y_{bb}(n-m_1-m_2)$, where $y_{bb}$ is a complex baseband signal, also known as the 'Complex Envelope'. When the terms are replaced by the real wide band model having terms of the form $y(n-m_1)^k y(n-m_1-m_2)$, in which y is a real wideband signal, all the distortion terms (both even and odd) over the observed bandwidth are modelled. Note that the vector $y(n-m_1)$ is raised to both even and odd powers (not just raised to the 2k), i.e., $y(n-m_1)^k$, and the result is multiplied by the vector $y(n-m_1-m_2)$, for both even and odd behavior. Effectively, the basis terms take both even and odd ordered terms into account.

In an example, the true real wide band model has the following basis terms: $\Re\{y_{bb}(n-m_1)\}^k \Re\{y_{bb}(n-m_1-m_2)\}$, where $$\Re \stackrel{def}{=} \text{real}\{\}.$$

The formulation can take the complex (baseband or passband) vector $y_{bb}(n-m_1)$, and can take the real component of the vector (or drops the imaginary term), e.g., resulting in $\Re\{y_{bb}(n-m_1)\}^k$. The real component is raised to the kth power (capturing both odd and even behavior), and the result is multiplied by the real component of the vector, i.e., $\Re(\{y_{bb}(n-m_1-m_2)\}$.

In some cases, a Hilbert transform can be applied to the product: $\mathcal{H}(\Re\{y_{bb}(n-m)\}^k \Re\{y_{bb}(n-m_1-2)\})$, in which $$\Re \stackrel{def}{=} \text{real}\{\},$$

$\mathcal{H}\{\}$ represents the Hilbert Transform. As before, the formulation takes the complex (baseband or passband) vector $y_{bb}(n-m_1)$, and takes the real component of the vector (or drops the imaginary term), e.g., $\Re(\{y_{bb}(n-m_1)\}^k$. The real component is raised to the kth power (capturing both odd and even behavior), and the result is multiplied by the real component of the vector, e.g., $\Re\{y_{bb}(n-m_1-m_2)\}$. Then, the Hilbert transform can be applied to the final result to convert the real wide band vector into a complex entity. Advantageously, the Hilbert transform can convert the real wide band vector into an analytical signal to capture phase offsets between the input vector and the output vector. Moreover, the analytical signal having a one-sided spectrum only occupies half the bandwidth of the real equivalent signal. Accordingly, it is possible to drop the sample rate by 2 and still satisfy the Nyquist criterion while gaining from the attending savings.

By applying the true real wide band model, all of the even and odd ordered IMD terms and HD terms can be captured by the model, making this model suitable for ultra wide band applications, such as wired Cable communications transmitters.

In the above example, a Generalized Memory Polynomial is shown. However, other models for non-linear behavior accounting for memory effects can be used, with the models operating on the real component of the signals to benefit from the true real wide band effect. For instance, the Volterra series can be used, which can have higher dimensionality than the GMP formulation shown. The general discrete time Volterra series can be formulated as follows:

$$y(t) = h_0 + \sum_{n=1}^{N} \int_a^b \cdots \int_a^b h_n(\tau_1, \ldots, \tau_n) \prod_{j=1}^{n} x(t-\tau_j) d\tau_j$$

In which x(t) is the input signal and y(t) is the output signal, and the function $h_n(\tau_1, \ldots, \tau_n)$ is called the n-th order Volterra kernel (as a higher-order impulse response of the system). Since digital pre-distortion in the present disclosure can fit the output signal to an inverse model, an inversed version of the Volterra series formulation seen above can be used. Variations to the Volterra series (or any of the models for non-linear behavior accounting for memory effects) to limit its dimensionality and/or memory depth of its memory are envisioned by the present disclosure, and such uses or simplifications can depend on the application requirements.

Complex Digital Pre-distortion System Example Using the True Real Wide Band Model Power amplifier non-linear memory effects become progressively more pronounced as the signal bandwidth widens (more frequency dependent effects). These deepening memory effects becomes more of a reality with the consequential growth in model complexity. When applying digital pre-distortion using the true real wide band model, the size of the problem increases tremendously. For ultra wide bandwidth applications, digital pre-distortion with the real wide band model can quickly become impractical due to deepening memory effects. The solution can become numerically ill-conditioned, and model robustness can potentially degrade due to over-fitting. Moreover, even if a numerically robust solution can be found, the cost both in resources (e.g., number of logic gates or other circuit components, number of instructions) and power consumption can become prohibitive. To address this issue, a reduced complexity solution can be implemented in which the number of model coefficients can be reduced. By applying compressive sensing, the number of terms can be reduced significantly, which reduces the complexity of the problem (e.g., number of unknowns in a system of equations) to be solved by digital pre-distortion. Furthermore, a DPD actuator circuit for pre-distorting the signal can also be adapted to use less resources.

Using, for example, (but not limited to) a real wide band Generalized Memory Polynomial (GMP) as the DPD structure with memory extending back over a horizon or depth of $M_1+M_2$, without compressive sensing, digital pre-distortion uses all indexes, e.g., $m_1=0, 1, 2, \ldots, M_1$. For example, for $M_1=128$ and $M_2=2$, the memory will extend over a depth of 130. A $K^{th}$ order system involves a solution to a $(M_1+1)(M_2+1)K$ system of equations. For the example above with K=7, the solution to a system of equations with 2709 unknowns would need to be solved. In practice solving such a system of equations is problematic due to numerical ill-condition and over-fitting. Moreover, the DPD actuator will involve $(M_1+1)(M_2+1)K$ arithmetic operations (add, multiply) which will be resource and power hungry since such operations must run in real-time on live transmit data. Another approach that relaxes the computational burden in solving the DPD system equations and realizing the actuator can be implemented to address such problems for such deep memory systems.

Applying Compressive Sensing to Reduce Basis Terms

To reduce the number of basis terms, it is possible to apply compressive sensing concepts, e.g., orthogonal matching pursuit (OMP) to search the space and determine which basis terms are the important ones. Once the important basis terms are identified systematically with compressive sensing, a reduced model can be formed, which can be used for digital pre-distortion. The number of unknowns to solve for with a reduced model can be cut down drastically. Compressive sensing can be utilized to find a 'sparse' solution to the DPD system of equations. A sub-optimum but 'sparse' solution can be found even where only a select number of coefficients are non-zero with the remainder forced to be zero. In an approach, the inverse model (DPD) can be expressed in matrix notation $\hat{x}=Y\hat{h}$, where Y is an N×M measurement or regressor matrix, which is composed of M column N×1 regressor or basis vectors. For example, in the case of the real GMP model, the basis matrix can be composed of basis terms or basis vectors of the form $y_{km_1m_2}=y(n-m_1)^k y(n-m_1-m_2)$. $\hat{h}$ is the vector of unknown DPD coefficients. In one approach to a DPD solution (e.g., least squares) all M basis vectors are used. When compressive sensing is applied, the improved DPD solution can replace the full regressor matrix by a sparse regressor matrix, $Y_s$ in which a select number of the column or basis vectors (e.g., column vectors corresponding to basis terms) can be replaced by zero column vectors. The inverse model can then be fitted in a Least Squares sense to, $\hat{x}=Y_s\hat{h}_s$. The sparse solution $\hat{h}_s$ vector can then include a reduced/minimum number non-zero entries with all the other entries being zero.

Figure 10:
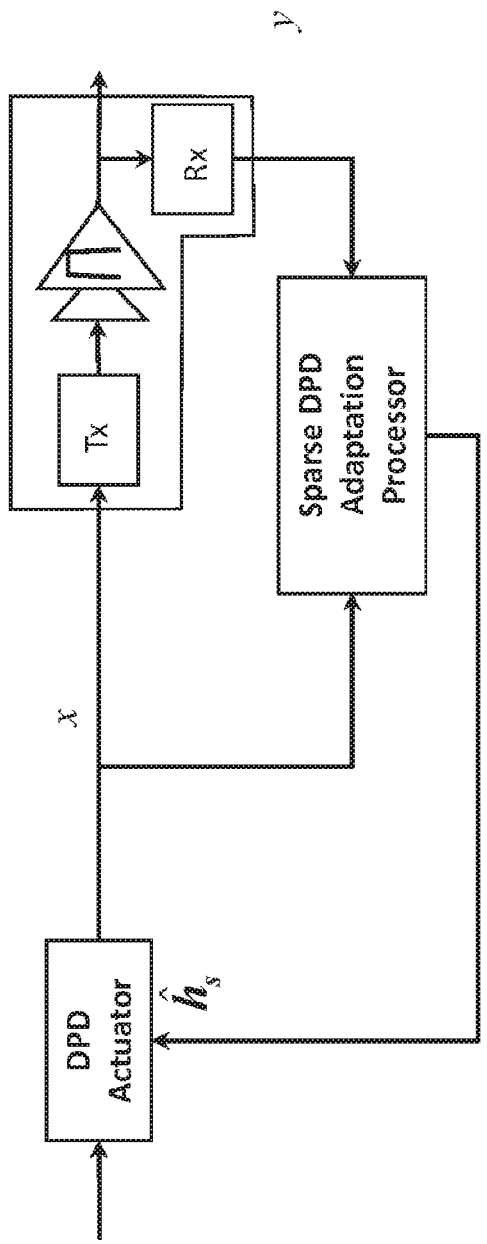
FIG. 10 illustrates a sparse digital pre-distortion system.

FIG. 10 illustrates an example of a sparse digital pre-distortion system. One of many Compressed Sensing algorithms can be applied to adapt the DPD. As an illustrative example, Orthogonal Matching Pursuit (OMP) as described below. OMP can look at all the basis terms, and can perform a cross correlation of all the basis terms, e.g., one by one individually with the output, such as to determine which of these basis terms are most correlated with the output in a greedy fashion. OMP can take the most correlated one and use it to model the output and to determine a residual. Then, OMP can use the residual to find the next most correlated basis term with the output, together with a residual. The process can repeat until OMP reaches the number of terms desired. OMP may be particularly suited for DPD because OMP can involve a least squares step at the end, which can be used in place of the least squares step in solving the equations for DPD. OMP can also provide a reasonable trade off between complexity versus performance. From a resource point of view, OMP is economical. It is envisioned by this disclosure that other compressive sensing techniques besides OMP can be applied to generate the sparse regressor matrix.

To begin, the non-sparse, classical regressor or basis matrix, Y can first be constructed. OMP can be applied to the non-sparse, dense regressor or basis matrix Y, such as to eliminate the redundant or inactive basis terms or basis vectors from Y, such as to yield the Sparse basis matrix, $Y_s$. The Least Squares solver can then be employed to yield the sparse coefficient vector $$\hat{h}_s = \min_{\hat{h}_s} \|x - Y_s\hat{h}_s\|.$$

$\hat{h}_s$ can then be applied to the DPD actuator. OMP applied to DPD can involve an algorithm or process as follows:

Generate all basis terms $Y=[y_1 \ldots y_{km_1m_2} \ldots y_{KM_1M_2}]$ which is an N×M matrix of column basis vectors;

Compress basis matrix to obtain $Y_s=[y_1 \ldots y_s \ldots y_S]$, which is an N×S (S≤M matrix of column basis vectors; and Solve DPD equations (e.g., using least squares) to obtain $$\hat{h}_s = \operatorname{argmin}_{\hat{h}_s} \|x - Y_s\hat{h}_s\|.$$

System Considerations for Implementing a Sparse DPD Adaptation Processor

Figure 11:
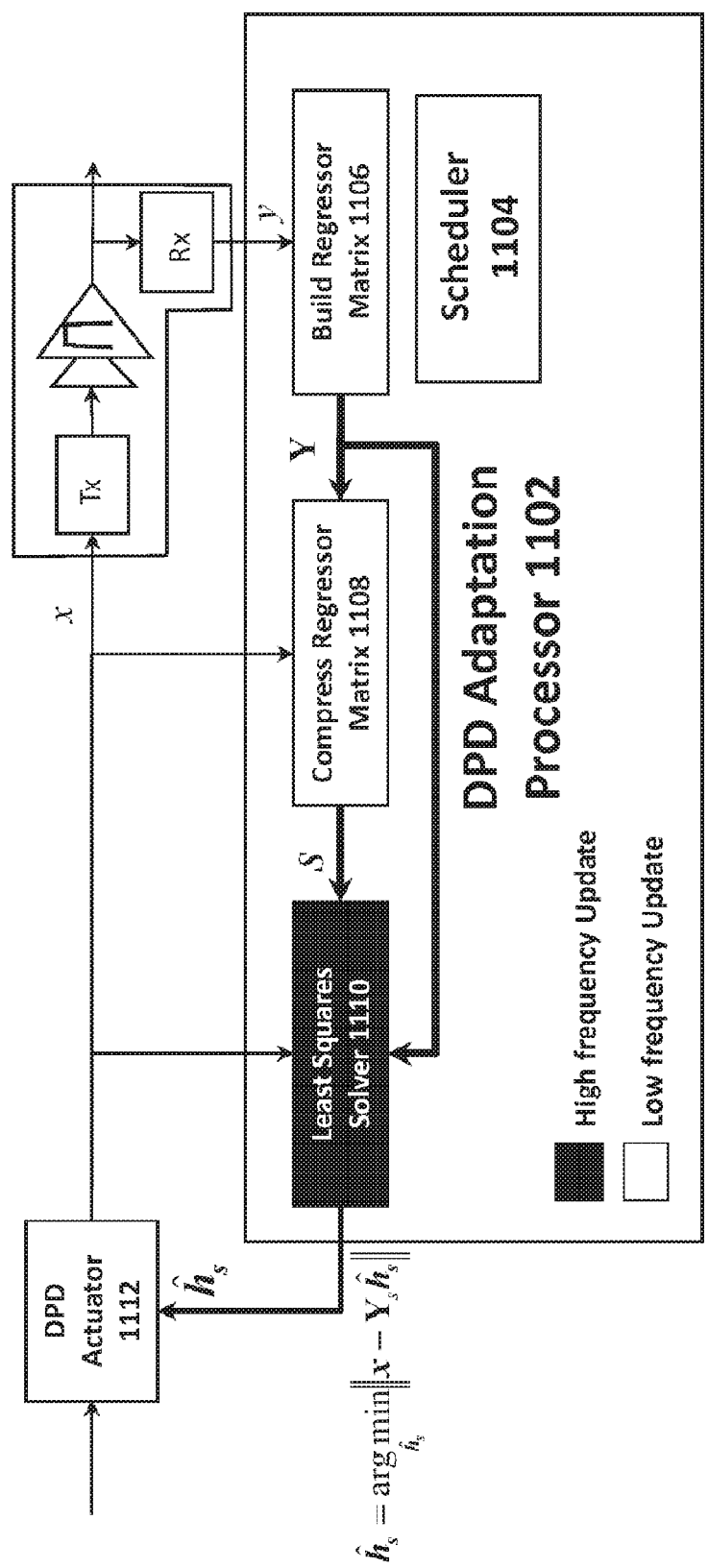
FIG. 11 illustrates system components of a sparse digital pre-distortion adaptation processor.

Implementing compressed sensing for digital pre-distortion can involve taking various system considerations to take into account. FIG. 11 illustrates an example of system components of a sparse digital pre-distortion adaptation processor circuit. DPD can involve an adaptation step in which the DPD coefficients $\hat{h}_s$ are solved. The adaptation step can be implemented by a DPD adaptation processor circuit 1102 (e.g., such an embedded microprocessor circuit), and can be performed offline. An observed vector y can be fed into the build regressor matrix 1106, such as to build the dense N×M matrix, which, as explained above, can include a lot of redundant terms. The dense N×M matrix can be compressed by the compress regressor matrix circuit 1108, such as to generate a sparse N×S matrix. The least squares solver circuit 1110 can then solve the DPD equations based on the sparse matrix. A scheduler component 1104 can be introduced for the adaptation step (e.g., in the DPD adaptation processor 1102) so that the compression regressor matrix circuit 1108 and least squares solver circuit 1110 can be separately timed and sequenced.

To realize savings in power, the build regressor matrix circuit 1106 can be run at a lower repetition rate. For example, column entries of the fully populated or dense matrix Y can be evaluated less frequently, e.g., on power up and in response to a major system change, such as a change in a biasing condition of the power amplifier circuit, a change in temperature exceeding a threshold value, etc. After the dense matrix Y is generated, the compression regressor matrix component 1108 can be run, e.g., once, such as to identify the important basis terms (e.g., column vectors) to generate the sparse N×S matrix $Y^s$. After the compressions regressor matrix component 1108 is run, then the build regressor matrix component 1106 can be run, such as only to evaluate the spare (unimportant) column vectors Y.

The build regressor matrix component 1106 and the compress regressor matrix component 1108, which identifies the indices or location of the non-zero regressor vector s, can be run at a different rate than the least squares solver (which can be run much less frequently). The least squares solver component 1110 can be run occasionally or periodically at a higher repetition frequency such as to track out expected temporal variation in power amplifier non-linear behaviour (e.g., due to a change in biasing or temperature conditions of the PA). The compression routine can be run more infrequently following major changes to the PA behavior. For instance, the compression regressor matrix component 1106 can run the compression algorithm on power-up or in response to a major change in load, temperature, biasing, or change in root mean squared (RMS) power level in the transmitter, which may require recalibration.

System Considerations for Implementing Sparse DPD Actuator

While the DPD adaptation step can occur offline, the DPD actuator in the forward path operates in real-time and online, and can thus impose some system considerations. For real-time and online modifications to the digital input signal, dedicated circuit hardware can be provided on-chip, such as to distort the digital signal. The dedicated hardware can involve several or many circuits that can generate all possible regressor terms that the DPD actuator may have to provide (e.g., if is not known which basis terms can be removed by the compressor regressor matrix component 1108).

Figure 12:
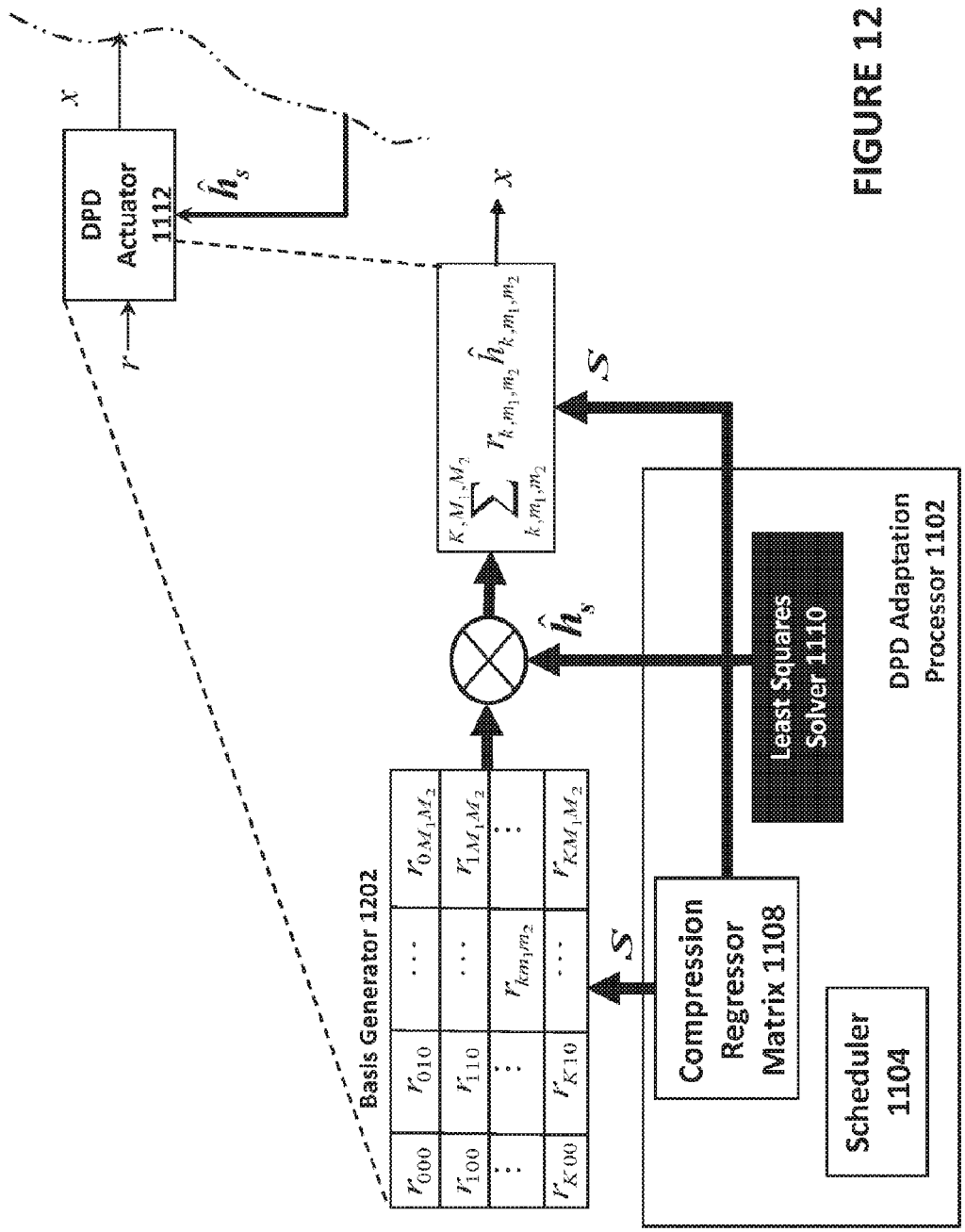
FIG. 12 illustrates system components of a digital pre-distortion actuator working with a sparse digital pre-distortion adaptation processor.

FIG. 12 illustrates an example of a system components of a digital pre-distortion actuator 1112 working with a sparse digital pre-distortion adaptation processor. To save power, an improved configuration of the DPD actuator 1112 can work with the DPD adaptation processor 1102. For example, the compression regressor matrix component 1108 can function so that the DPD actuator 1112 can adapt dynamically to turn on only hardware circuits or cells corresponding to the reduced set of basis terms in the reduced regressor matrix, and to turn off the unneeded hardware circuits or cells which have been eliminated by the compression regressor matrix module 1108. Referring back to the DPD actuator 1112 of FIGS. 11 and 12, the DPD actuator can include circuitry or cells for all the basis terms of the form $r_{km_1m_2}=r(n-m_1)^k r(n-m_1-m_2)$ (seen as Basis Generator 1202), and circuitry for forming the inner product with $\hat{h}_s$ over K, $M_1$, $M_2$. Circuitry or cells in the basis generator can involve raising a number to a $k^{th}$ power, which can involve a great number of multiplications. Circuitry or cells in forming the inner product can also involve a great number of multiplications. However, as now the coefficient vector is sparse, only the terms associated with non-zero entries in $\hat{h}_s$ need be evaluated (which can yield savings in power). The basis terms and inner product associated with zero entries in $\hat{h}_s$ need not be evaluated. Accordingly the corresponding circuitry or cells for those basis terms and inner products associated with zero entries in $\hat{h}_s$ can be powered down. Since the index or distribution of the active and inactive components are dynamic (potentially changing in a random or unpredictable fashion whenever the compression algorithm is executed), the actuator configuration can also be dynamic so that the necessary generator operations can be enabled and disabled as desired. The self-configuration of the DPD actuator 1112 can be performed on a dynamic basis, for example, in response to the execution of the compression algorithm (e.g., in response to every time when it is run). The DPD actuator 1112 can enable and disable different circuitries/cells in the basis generator.

Ultra Wide Band Transmit Equalizer

Figure 13:
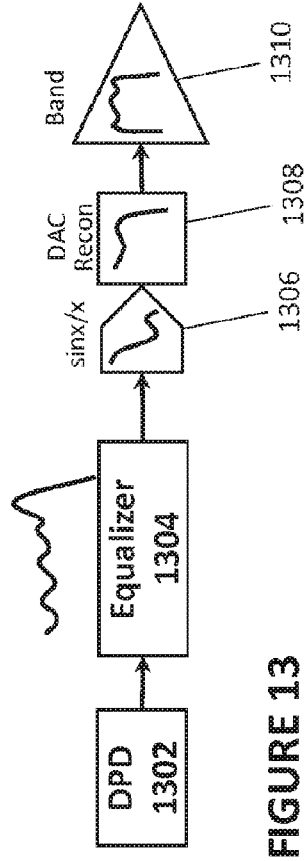
FIG. 13 illustrates an equalizer.

FIG. 13 illustrates an example of an equalizer circuit 1304. The DPD 1302 looking into the transmitter would like to see a flat linear gain response and a constant group delay or linear phase response from the DPD 1302 to the power amplifier 1310 for ideal operation. In practice, the power amplifier 1310's band pass response may have a ripple, so the gain may vary as across the pass band. The DAC reconstruction filter 1308 can have some gain variation, especially near its band edge. The DAC 1306 can have a DAC rolloff having a sin x/x response. There can be undesirable phase response as well somewhere from the DPD 1302 to the power amplifier 1310. Thus, DAC sin x/x, filtering and power amplifier band filter rolls off near the band edges, in-band gain variation, and nonlinear phase response are a variety of contributors to a non-flat linear gain response and a non-constant group delay or non-linear phase response, which can adversely affect DPD performance. To address this issue, a (linear) equalizer circuit 1304 can be included between the DPD and the transmitter. The equalizer 1304 can equalize out the gain and phase responses. As a result, when the DPD is looking into the equalizer, the linear response DPD sees a flat gain over the band and constant group delay or linear phase response. Training and coupling the equalizer 1304 to the true real wide band DPD solution (potentially implementing compressive sensing as well) can be needed.

Figure 14:
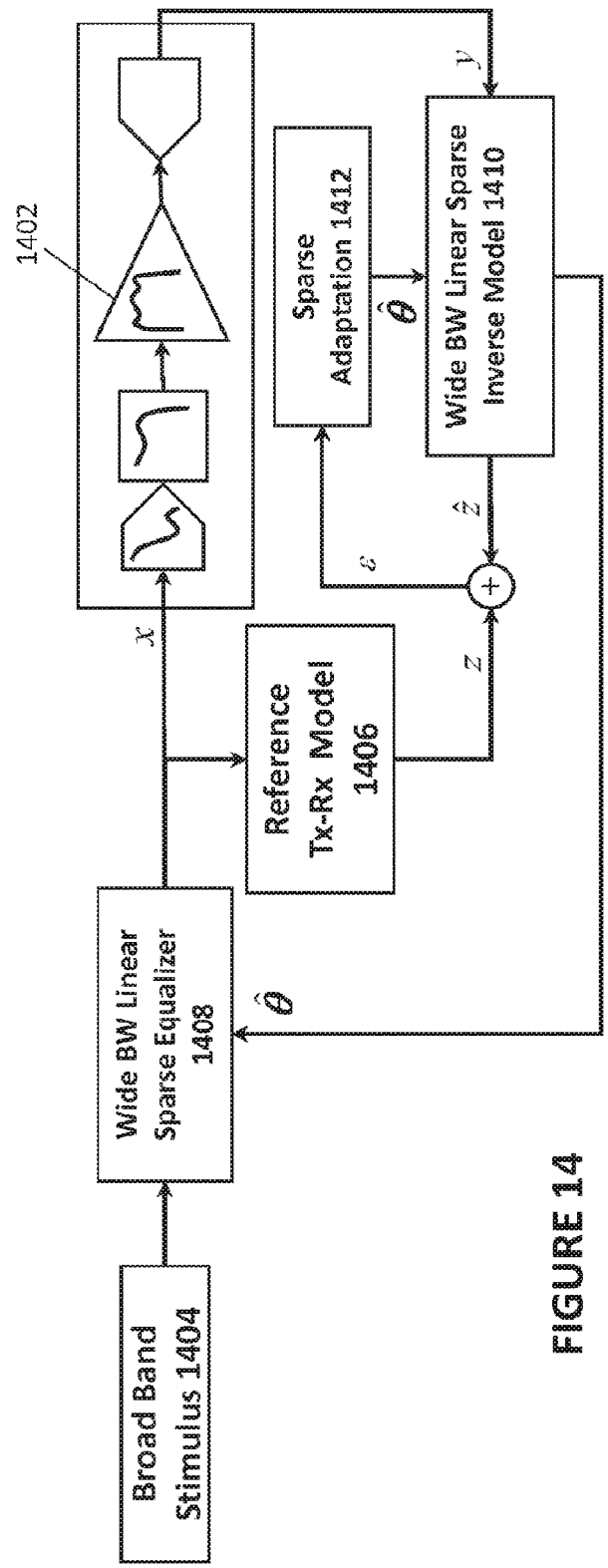
FIG. 14 illustrates training an equalizer.

Training the equalizer can be done infrequently, e.g., on power up, or when the transmit linear response is suspected of deviating from original power-up training solution. FIG. 14 illustrates an example of training an equalizer. The power amplifier 1402 can be backed off to operate in its linear region (e.g., so that there is negligible distortion and the loop is running linearly) and a broad band stimulus 1404 can then be applied. A reference model, the reference transmit-receive (Tx-Rx) model 1406 and an indirect learning architecture can be used to extract or train the wide bandwidth (BW) linear sparse equalizer 1408. The reference model (e.g., the reference transmit-receive (Tx-Rx) model 1406) can provide the desired Tx-Rx linear response, for example, having a flat gain and linear phase response over the band of interest. The reference model (e.g., the reference transmit-receive (Tx-Rx) model 1406) can include a finite impulse filter (FIR) circuit. The FIR filter can provide a flat gain to the band edge and linear phase or constant group delay to the band edge. The wide bandwidth (BW) linear (sparse) inverse model 1410 can include only linear terms (e.g., can omit non-linear terms). It is not essential for the model to operate on the real component of the signal. In some cases, it can be preferable to apply the Hilbert transform to the signal to model complicated phase and amplitude information in the signal to improve the equalization (which can be directed toward flat gain and linear phase).

To train the equalizer circuit 1304, e.g., for using the wide bandwidth (BW) linear (sparse) inverse model 1410, the input x can be filtered by the reference model (the reference transmit-receive (Tx-Rx) model 1406), and the output y can be used to fit the linear inverse model 1410 such as to drive the inverse output $\hat{z}$ to equal to the reference output z. When the training converges, $\hat{\theta}$ coefficients are solved, where the $\hat{\theta}$ coefficients can make inverse output $\hat{z}$ to equal to the reference output z. Because the output signal y is a wide band signal, compressive sensing can be applied by sparse adaptation component 1412 such as to help reduce the basis terms and the number of $\hat{\theta}$ coefficients, making the linear inverse model 1410 a linear sparse inverse model 1410. In this case, the basis terms used for equalization are linear (note the basis terms are non-linear for DPD).

Figure 15:
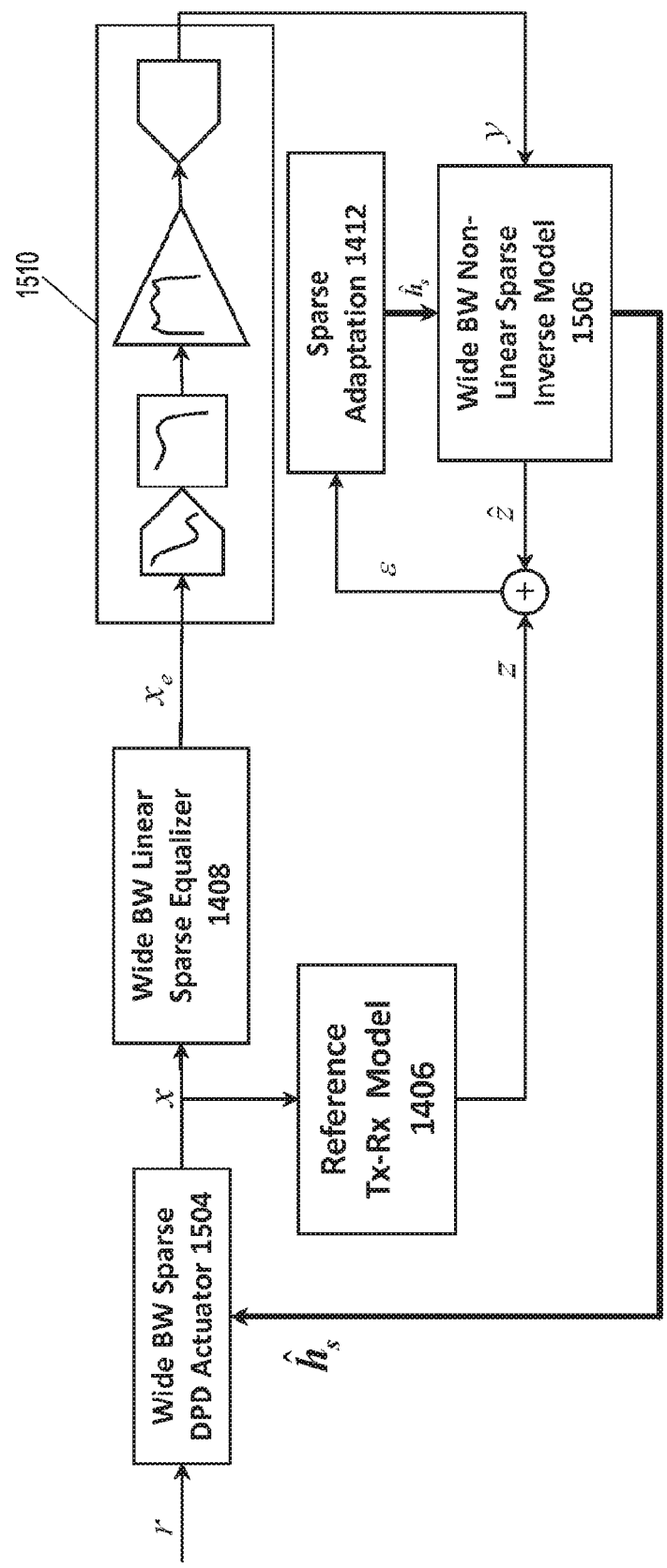
FIG. 15 illustrates an equalizer digital pre-distortion mode.

After training the equalizer circuit 1304, the equalizer 1304 can be applied to the DPD 132 output. FIG. 15 illustrates an example of an equalizer 1304 operating in a digital pre-distortion (DPD) mode. In this example, as shown, the wide bandwidth (BW) linear sparse equalizer 1408 can be interposed between the output of wide bandwidth (BW) sparse DPD actuator 1504 and the input to the transmitter 1510. The wide bandwidth (BW) linear sparse equalizer 1408 can be trained, such as according to the illustration in FIG. 14, where $\hat{\theta}$ coefficients have been determined. The wide bandwidth (BW) linear sparse equalizer 1408 can take the DPD output signal x and can produce equalizer output signal $x_e$, based on the $\hat{\theta}$ coefficients. The reference Tx-Rx model 1406 can take the DPD output signal x as its input to generate a reference signal z. The reference signal z can be used in the training of the DPD (which is shown as the sparse adaptation component 1412 and wide bandwidth (BW) non-linear sparse inverse model 1506).

Method for Sparse Equalization

FIG. 16 shows a flow diagram illustrating an example of a method 1600 for ultra wide band equalization. At 1602, the method 1600 can include modelling an inverse linear response as a linear sum of basis terms of the form: $\mathcal{H}\{\Re\{\tilde{y}(n-q)\}\}$. The basis terms can be linear (e.g., without any non-linear terms). y represents the real power amplifier output signal. Its complex baseband or passband equivalent is $\tilde{y}=\mathcal{H}\{y\}$. $\Re\{\}$ is the real component. $\mathcal{H}\{\}$ is the Hilbert transform. Applying $\mathcal{H}\{\}$ is not essential, but applying $\mathcal{H}\{\}$ can improve phase and amplitude modeling and thus improve equalization. At 1604, the method 1600 can include applying compressive sensing to the basis terms to determine which ones are more important than others and to generate a reduced set of basis terms. At 1606, the equalizer can be trained, e.g., fitting the inverse model, which can involve solving $\hat{\theta}$ coefficients based on the transmitter circuit output signal y (e.g., modeled by the basis terms or the reduced set of basis terms) and a reference signal z (which can be generated by a reference Tx-Rx model processing the input signal x), such as explained with respect to FIG. 14. After the equalizer is trained, the system can train the DPD model. During operation, the $\hat{\theta}$ coefficients can be used by a linear (sparse) equalizer applied to the output of the DPD, such as shown in FIG. 14. Specifically, the equalizer (if used) can be applied to the pre-distorted signal (x as seen in FIG. 15), such as to generate a further signal ($x_e$ as seen in FIG. 15) for use as input to the transmitter.

FIG. 17 shows a flow diagram illustrating an example of a method 1700 for ultra wide band digital pre-distortion. DPD can be applied in combination with a suitable equalization scheme, where the suitable equalization scheme can be used to improve operation, for example, the stability of the DPD. Examples of a suitable equalization schemes are described herein. At 1702, the method 1700 of ultra wide band digital pre-distortion can include modeling inverse power amplifier behavior as a linear sum of basis terms of the form: $\mathcal{H}\{\Re\{\tilde{y}(n-m_1)\}^k \Re\{\tilde{y}(n-m_2)\}\}$. The basis terms can include non-linear terms. y is the real power amplifier output signal. Its complex baseband or passband equivalent is $\tilde{y}=\mathcal{H}\{y\}$. $\Re\{\}$ is the real component. $\mathcal{H}\{\}$ is the Hilbert transform. Operating on the real signal component results in generating important multi zonal terms to get the wide band effect (such as illustrated in FIG. 5). The complex baseband model can only generate terms around the fundamental or zone 1. Moreover, using the real components models the negative frequency fold-over behavior (illustrated in and described with respect to FIGS. 6-7). While applying the Hilbert transform is optional, the Hilbert transform can convert the signal into an analytical signal and can allow the signal to be processed as a complex envelope, e.g., in terms of its instantaneous amplitude and phase. Accordingly, when modelling with the analytical signal, it is possible to facilitate both amplitude and phase modeling and achieve better amplitude and phase accuracy. At 1704, the method 1700 can include applying compressive sensing to basis terms to generate a reduced regressor matrix. At 1706, the DPD can be trained, such as by fitting the inverse model of the PA. This can involve solving $\hat{h}$ coefficients (or a sparse version thereof) based on the transmitter output signal y (modeled by regressor matrix or a compressed/sparse regressor matrix) and a reference signal z (which can be generated by a reference Tx-Rx model processing the input x), such as explained with respect to FIG. 15. During operation, the $\hat{h}$ coefficients (or a sparse version thereof) can be used by a DPD actuator and applied the digital input such as to generate a pre-distorted input, e.g., as illustrated by FIGS. 11, 12, 13, and 15. The pre-distorted input can be provided to the equalizer for equalization before the signal is provided to the transmitter.

Generally speaking, training of the equalization model and determination of $\hat{\theta}$ coefficients occur before the training of DPD and determination of the $\hat{h}$ and/or $\hat{h}_s$ coefficients. After the models are solved (first the equalization model, then the DPD model), equalization and/or digital pre-distortion can be applied in the forward path. For instance, digital pre-distortion is applied to the original digital input signal (r as seen in FIG. 15) to generate a pre-distorted signal (x as seen in FIG. 15). Equalization is applied to the pre-distorted signal and the output of the equalizer is provided as input to the transmitter.

Exemplary Features

The present disclosure describes ultra wide band (e.g., ≥1 GHz contiguous) digital pre-distortion. Some multi-band DPD solutions may include a cumulative bandwidth over 100 MHz but the cumulative bandwidth is discontiguous. In ultra wide band DPD, the narrowband, passband PA assumption fails as the broad band IMD and HD terms are not captured by the complex baseband model. Moreover, if the band extends towards DC, negative frequency terms can fold over into the band and these too are not captured by the complex baseband model. The present disclosure replaces the complex baseband model formulation (which presumes a narrow passband PA response) with a true real wide band model that can capture broad band IMD and HD behavior (not just Zone 1) as well as negative frequency folding effects around DC.

Moreover for widening bandwidths, power amplifier memory effects can become more pronounced resulting in very complex and resource hungry DPD solution and possibly unsolvable DPD equations (especially when all even and odd ordered terms are modelled). A simplified or sparse solution (reduced number of unknowns in the DPD equation) can be implemented such as using compressed sensing. Partitioning of an adaptation step into compression and solver steps can be helpful since the compression and solver steps can be scheduled or sequenced independently to reduce consumption of resources. Furthermore, the DPD actuator running in real-time can adapt dynamically such as to further reduce power consumption based on the reduced regressor matrix.

DPD ideally wants to see a flat linear gain and a linear phase transmit response (otherwise additional DPD resources have to be unnecessarily expended to equalize the transmit response or in some cases the DPD may even fail (such as by becoming unstable)). In the ultra wide band case, ensuring the linear gain is flat and the phase is linear is not a given and so a digital equalizer can be interposed between the DPD and transmitter. To mitigate costs, which can grow rapidly with bandwidth, a sparse equalizer can be implemented.

Variations and Implementations

In general, linearization of a power amplifier can help to improve the efficiency of the power amplifier. Improving efficiency of the power amplifier can result in less power being drawn by the power amplifier. Reducing power consumption and increasing efficiency can lower operational and capital equipment costs. Furthermore, reducing power consumption means more Watts in the power budget can be used by other components of the system, such as a processor (e.g., a field effect programmable gate array) configured for digital front-end processing of the transmit signal. Besides digital pre-distortion, other techniques such as envelope tracking, can also be implemented to improve efficiency of power amplifiers. Implementing the power saving techniques in the adaptation processor and the DPD actuator such as described herein can provide even further power savings.

Components of various systems for providing ultra wide band digital pre-distortion and equalization can include electronic circuitry to perform the functions described herein. In some cases, one or more parts of the circuits can be provided by a processor circuit, which can be specially configured for carrying out the functions described herein. For instance, the processor may include one or more application specific components, or may include programmable logic gates which can be configured to carry out the functions describe herein. The circuitry can operate in analog domain, digital domain, or in a mixed-signal domain. In some instances, the processor may be configured to carrying out the functions described herein by executing one or more instructions stored on a non-transitory computer medium.

In an example, the electrical circuits represented in the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to ultra wide band digital pre-distortion and equalization, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The claimed invention is:

1. A system to drive a load with a wideband signal, the system comprising:
   a digital predistortion (DPD) circuit, including a DPD input to receive a DPD input signal and a DPD output providing a DPD output signal based upon which a power amplifier (PA) circuit is driven for communicating a PA output signal onto the load, wherein the DPD circuit is configured to operate according to an inverse model of the PA circuit;
   a scheduler circuit;
   the inverse model of the PA circuit including a set of basis terms to capture both odd and even harmonics or both odd and even other non-linear terms, wherein the DPD circuit is configurable to a first mode in which hardware corresponding to a first reduced set of basis terms selected from the basis terms is turned on and hardware not corresponding to the first reduced set of basis terms is turned off and wherein the DPD circuit is also configurable to a second mode in which hardware corresponding to a second reduced set of basis terms selected from the basis terms is turned on and hardware not corresponding to the second reduced set of basis terms is turned off;

the scheduler circuit configured to perform operations comprising:
scheduling building the inverse model using the set of basis terms; and
compressing the inverse model to generate a sparse inverse model at least in part by providing tested basis terms that meet at least one criterion for eliminating basis terms, wherein the second reduced set of basis terms comprises at least a portion of the tested basis terms.

2. The system of claim 1, wherein the sparse inverse model excludes tested basis terms that do not meet the at least one criterion for eliminating basis terms.

3. The system of claim 2, wherein the sparse inverse model includes tested basis terms that have been tested using an orthogonal matching pursuit (OMP) technique.

4. The system of claim 1, wherein the set of basis terms include Hilbert-transformed basis terms.

5. The system of claim 1, in which the inverse model of the PA circuit excludes complex-valued basis terms and includes only real-valued basis terms.

6. A method of driving a load with a wideband signal, the method comprising:
generating an inverse model of a Power Amplifier (PA), the inverse model including a set of basis terms to capture both odd and even harmonics or both odd and even other non-linear terms;
arranging a digital predistortion (DPD) circuit to a first mode that enables hardware corresponding to a first reduced set of basis terms including less than all of the set of basis terms;
arranging the DPD circuit to a second mode that enables hardware corresponding to a second reduced set of basis terms different than the first reduced set of basis terms and including less than all of the set of basis terms, and disables at least a portion of the hardware corresponding to the first reduced set of basis terms;
scheduling building of the inverse model using the set of basis terms; and
compressing the inverse model to generate a sparse inverse model at least in part by providing tested basis terms that meet at least one criterion for eliminating basis terms, wherein the second reduced set of basis terms comprises at least a portion of the tested basis terms.

7. The method of claim 6, wherein the second reduced set of basis terms comprises tested basis terms that meet at least one criterion for eliminating redundant or inactive basis terms and excludes tested basis terms that do not meet the at least one criterion for eliminating redundant or inactive basis terms.

8. The method of claim 6, further comprising excluding from the sparse inverse model tested basis terms that do not meet the at least one criterion from the sparse inverse model.

9. The method of claim 8, comprising generating the sparse inverse model using an orthogonal matching pursuit (OMP) technique.

10. The method of claim 8, comprising scheduling building the inverse model independently from generating the sparse inverse model.

11. The method of claim 6, comprising using Hilbert-transformed real-valued basis terms as the set of basis terms in the inverse model of the PA.

12. The method of claim 6, comprising:
equalizing a predistorted signal to produce an equalized signal;
converting, using a digital-to-analog conversion, the equalized signal into an analog signal to be provided to an input of the PA; and
feeding back a signal observed downstream from the PA circuit.

13. The method of claim 12, wherein feeding back the signal observed downstream from the PA circuit is used to form or adjust the inverse model.

14. The system of claim 1, wherein the scheduler circuit is further configured to perform operations comprising:
compressing the inverse model into the sparse inverse model by providing tested basis terms that meet the at least one criterion for eliminating redundant or inactive basis terms.

15. The system of claim 14, wherein the scheduler circuit is further configured to be capable of applying a compression regressor matrix and applying a least squares solver.

16. The system of claim 1, further comprising:
a transmitter circuit including the PA circuit, the transmitter circuit also including a digital-to-analog converter (DAC) circuit between the DPD circuit and the PA circuit;
an equalizer circuit located between the DPD circuit and the transmitter circuit; and
an observation receiver circuit feeding back a signal from downstream of the PA circuit to the DPD circuit via the inverse model of the PA circuit.

17. A system for driving a load with a wideband signal, comprising:
means for generating an inverse model of a Power Amplifier (PA) circuit, the inverse model of the PA circuit including a set of basis terms to capture both odd and even harmonics or both odd and even other non-linear terms;
means for predistorting a received digital input signal, wherein the means for predistorting the received input signal is configurable to a first mode that uses hardware corresponding to a first reduced set of basis terms including less than all of the set of basis terms and to a second mode that, uses hardware corresponding to a second reduced set of basis terms different than the first reduced set of basis terms and including less than all of the set of basis terms, and turns off at least a portion of the hardware corresponding to the first reduced set of basis terms;
means for scheduling building of the inverse model using the set of basis terms; and
means for compressing the inverse model to generate a sparse inverse model at least in part by providing tested basis terms that meet at least one criterion for eliminating basis terms, wherein the second reduced set of basis terms comprises at least a portion of the tested basis terms.

18. The system of claim 17, further comprising:
means for equalizing a predistorted signal to produce an equalized signal;
means for converting, using a digital-to-analog conversion, the equalized signal into an analog signal to be provided to an input of the PA; and
means for feeding back a signal observed downstream from the PA circuit to adjust the means for predistorting.

* * * * *